(12) United States Patent
Xie et al.

(10) Patent No.: US 12,249,589 B2
(45) Date of Patent: Mar. 11, 2025

(54) APPARATUS AND METHOD FOR BGA COPLANARITY AND WARPAGE CONTROL

(71) Applicant: Nvidia Corporation, Santa Clara, CA (US)

(72) Inventors: Dongji Xie, Santa Clara, CA (US); Joe Hai, Santa Clara, CA (US); Zhongming Wu, Santa Clara, CA (US); Ernesto A. Opiniano, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 421 days.

(21) Appl. No.: 17/833,063

(22) Filed: Jun. 6, 2022

(65) Prior Publication Data

US 2023/0395559 A1    Dec. 7, 2023

(51) Int. Cl.
*H01L 21/00* (2006.01)
*H01L 23/00* (2006.01)

(52) U.S. Cl.
CPC .............. *H01L 24/75* (2013.01); *H01L 24/81* (2013.01); *H01L 2224/7555* (2013.01); *H01L 2224/81201* (2013.01)

(58) Field of Classification Search
CPC .. H01L 24/75; H01L 24/81; H01L 2224/7555
See application file for complete search history.

(56) References Cited

U.S. PATENT DOCUMENTS

| | | | |
|---|---|---|---|
| 6,784,536 B1 * | 8/2004 | Eslamy | H01L 23/562 |
| | | | 257/E23.101 |
| 6,949,404 B1 * | 9/2005 | Fritz | H01L 23/3675 |
| | | | 438/106 |

(Continued)

FOREIGN PATENT DOCUMENTS

| | | | | |
|---|---|---|---|---|
| CN | 115563931 A | * | 1/2023 | |
| CN | 115954274 A | * | 4/2023 | ......... H01L 23/3675 |

(Continued)

OTHER PUBLICATIONS

"Design Requirement for Outlines of Solid State and Related Products"; JEDEC Design Standard; JEDEC Publication 95, Design Guide 4.14, Ball-Grid-Array Package (BGA); JEDEC Solid State Technology Association; Item 11.2-730(S), Issue F; Feb. 2007; 23 pgs.

(Continued)

*Primary Examiner* — Laura M Menz (57) ABSTRACT

Apparatus for flattening a warped ball grid array (BGA) package, including a first plate having a first surface and opposite second surface and a second plate having a first surface and opposite second surface. The first surface of the first plate and the first surface of the second plate oppose each other with a gap there-between. The gap houses the warped BGA package there-in, the warped BGA package including a package substrate with solder balls attached to a device mounting surface of the package substrate to form a BGA thereon. The gap adjustable by changing the position of the first plate or of the second plate such that a pushing force is applicable to the warped BGA package. A method of manufacturing a flattened BGA package and computer having a circuit that include the flatted BGA package are also disclosed.

32 Claims, 11 Drawing Sheets

(56) References Cited

U.S. PATENT DOCUMENTS

| | | | | |
|---|---|---|---|---|
| 7,459,782 B1* | 12/2008 | Li | ............... | H01L 23/49833 |
| | | | | 257/702 |
| 9,385,098 B2* | 7/2016 | Zhang | ............... | H01L 24/14 |
| 9,431,366 B2* | 8/2016 | Interrante | ............ | H05K 1/0271 |
| 10,262,970 B2* | 4/2019 | Interrante | ............ | H05K 3/3494 |
| 11,322,367 B1* | 5/2022 | Su | ............... | H01L 21/67092 |
| 11,830,785 B2* | 11/2023 | Lee | ............... | H01L 23/16 |
| 2008/0160671 A1* | 7/2008 | Liang | ............ | H01L 21/4853 |
| | | | | 257/E21.532 |
| 2009/0227136 A1* | 9/2009 | Tokii | ............... | H05K 3/301 |
| | | | | 29/840 |
| 2010/0008048 A1* | 1/2010 | Urai | ............... | H05K 1/0271 |
| | | | | 361/717 |
| 2011/0147918 A1* | 6/2011 | Hayashi | ............ | H01L 23/4006 |
| | | | | 257/E21.507 |
| 2014/0138823 A1* | 5/2014 | Zhang | ............... | H01L 22/12 |
| | | | | 257/737 |
| 2014/0256090 A1* | 9/2014 | Interrante | ............ | H01L 24/17 |
| | | | | 438/121 |
| 2014/0359995 A1* | 12/2014 | Blackshear | ............ | H01L 24/75 |
| | | | | 269/254 R |
| 2014/0359996 A1* | 12/2014 | Allard | ............... | H01L 23/36 |
| | | | | 269/254 R |
| 2015/0206862 A1* | 7/2015 | Opiniano | ............ | H01L 25/0657 |
| | | | | 257/737 |
| 2015/0235986 A1* | 8/2015 | Interrante | ............ | H01L 21/563 |
| | | | | 438/126 |
| 2016/0141264 A1* | 5/2016 | Nah | ............... | B23K 1/0016 |
| | | | | 219/616 |
| 2016/0329218 A1* | 11/2016 | Interrante | ............ | H01L 23/562 |
| 2016/0330848 A1* | 11/2016 | Interrante | ............ | H05K 1/181 |
| 2017/0287799 A1* | 10/2017 | Klein | ............... | H01L 23/16 |
| 2018/0084649 A1* | 3/2018 | Interrante | ............ | H01L 24/81 |
| 2019/0103345 A1* | 4/2019 | Yazzie | ............ | H01L 23/49816 |
| 2020/0253041 A1* | 8/2020 | Too | ............... | B23K 1/0008 |
| 2021/0035944 A1* | 2/2021 | Cheng | ............... | H01L 23/4006 |
| 2022/0117080 A1* | 4/2022 | Geng | ............... | H05K 1/181 |
| 2023/0118190 A1* | 4/2023 | Lee | ............... | H01L 23/053 |
| | | | | 257/712 |
| 2023/0395559 A1* | 12/2023 | Xie | ............... | H01L 24/75 |

FOREIGN PATENT DOCUMENTS

| | | | | |
|---|---|---|---|---|
| DE | 102013019280 A1 * | 5/2014 | ............ | H01L 22/12 |
| JP | 4607926 B2 * | 1/2011 | | |

OTHER PUBLICATIONS

"Reflow Flatness Requirements for Ball Grid Array Packages"; JEDEC Publication No. 95; Standard Procedures and Practices; No. SPP-024, Issue A, Item No. 11.2-783; Mar. 2009; 6 pgs.

Galloway; "Lidded Versus Bare Die Flip Chip Package: Impact on Thermal Performance"; Electronics Cooling; Jun. 21, 2012; 3 pgs.

* cited by examiner

610 — PROVIDE A WARPED BGA PACKAGE, THE WARPED BGA PACKAGE INCLUDING A PACKAGE SUBSTRATE WITH SOLDER BALLS ATTACHED TO A DEVICE MOUNTING SURFACE OF THE PACKAGE SUBSTRATE TO FORM A BGA THEREON, AND, AN OPPOSITE DIE SUBSTRATE MOUNTING SURFACE

612 — MOUNT A DIE TO THE DIE SUBSTRATE MOUNTING SURFACE

620 — POSITION THE WARPED BGA PACKAGE IN AN APPARATUS, THE APPARATUS INCLUDING A FIRST PLATE HAVING A FIRST SURFACE AND OPPOSITE SECOND SURFACE, A SECOND PLATE HAVING A FIRST SURFACE AND OPPOSITE SECOND SURFACE, WHEREIN: THE FIRST SURFACE OF THE FIRST PLATE AND THE FIRST SURFACE OF THE SECOND PLATE OPPOSE EACH OTHER WITH A GAP THERE-BETWEEN, AND THE GAP HOUSES THE WARPED BGA PACKAGE, AND THE WARPED BGA PACKAGE IS SITUATED SO THAT THE DEVICE MOUNTING SURFACE CONTACTS THE FIRST SURFACE OF THE FIRST PLATE AND THE DIE MOUNTING SURFACE CONTACTS THE FIRST SURFACE OF THE FIRST PLATE TO HOLD THE WARPED BGA PACKAGE BETWEEN THE FIRST AND SECOND PLATES

622 — CONTACT THE DEVICE MOUNTING SURFACE TO LEDGE SURFACES OF CORNER STEPS OF THE FIRST PLATE, THE CORNER STEPS DEFINING A CAVITY OF THE FIRST PLATE, WHEREIN INTERIOR PORTIONS OF THE DEVICE MOUNTING SURFACE LAY WITHIN THE CAVITY OF THE FIRST PLATE WITHOUT CONTACTING THE FIRST PLATE

624 — CONTACT THE DIE MOUNTING SUBSTRATE SURFACE LEDGE SURFACES OF CORNER STEPS OF THE SECOND PLATE, THE CORNER STEPS DEFINING A CAVITY OF THE SECOND PLATE, WHEREIN INTERIOR PORTIONS THE DIE SUBSTRATE MOUNTING SURFACE LAY WITHIN THE CAVITY OF THE SECOND PLATE WITHOUT CONTACTING THE SECOND PLATE

APPARATUS AND METHOD FOR BGA COPLANARITY AND WARPAGE CONTROL

TECHNICAL FIELD

This application is directed, in general, to integrated circuit (IC) chip operations and packaging, and in particular, an apparatus and method to flatten a warped ball grid array (BGA) package.

BACKGROUND

BGA, or Ball Grid Array, is a kind of a surface mount package which usually has a large number of pins in the form of solder balls that are arranged in a grid like pattern on the bottom of the package. The alloy of solder ball can be tin-silver-copper (SAC) based or others such as tin-bismuth (SB) based. A BGA package can include a substrate to facilitate mounting an interconnecting a die or IC chip ("die"). The die may be encapsulated as in plastic BGA. For the case of non-encapsulated die such as in flip chip BGA, it may have different format such as bare die with or without stiffener ring and lid. In all types of BGAs, a consistently reliable connection of all solder balls of the BGA to a target mounting surface of the electronic device is important for maintaining acceptable warpage and/or coplanarity as defined JEDEC Publication No. 95 and other industrial specifications. Such warpage can result in high yield losses, e.g., up 5 to 10% dependent to various types of BGAs. Ways to mitigate the yield loss can include using a sanding machine to grind down taller solder balls, but, this can reduce the solder ball volume and can impact solder joint reliability. Other ways can include using hot leveling methods such as used in testing and/or PCB assembly, or the use of under-fill curing and reflow soldering. There is a continuing need to increase the production yields by reducing BGA package warpage.

SUMMARY

One aspect provides an apparatus for flattening a warped ball grid array (BGA) package. The apparatus includes a first plate having a first surface and opposite second surface and a second plate having a first surface and opposite second surface. The first surface of the first plate and the first surface of the second plate oppose each other with a gap there-between. The gap houses the warped BGA package there-in, the warped BGA package including a package substrate with solder balls attached to a device mounting surface of the package substrate to form a BGA thereon. The gap is adjustable by changing the position of the first plate or of the second plate such that a pushing force is applicable to the warped BGA package.

Another aspect is a method of manufacturing a BGA package. The method includes providing a warped BGA package that includes a package substrate with solder balls attached to a device mounting surface of the package substrate to form a BGA thereon and, an opposite die substrate mounting surface. The method also includes positioning the warped BGA package in an apparatus. The apparatus includes a first plate having a first surface and opposite second surface, a second plate having a first surface and opposite second surface. The first surface of the first plate and the first surface of the second plate oppose each other with a gap there-between, and the gap houses the warped BGA package which is situated so that the device mounting surface contacts the first surface of the first plate and the die mounting surface contacts the first surface of the first plate to hold the warped BGA package between the first and second plates. The method further includes heating the apparatus with the warped BGA package positioned therein and applying a pushing force to the warped BGA package to thereby change the warped BGA package into a flatten BGA package.

Another aspect is a computer having one or more circuits that include any embodiments of the BGA package planarized by the apparatus of the disclosure herein.

BRIEF DESCRIPTION

Reference is now made to the following descriptions taken in conjunction with the accompanying drawings, in which.

DETAILED DESCRIPTION

Embodiments of the disclosure follow from our discovery that a combination of induced thermal creep and mechanical pushing can be used to correct warped BGA packages to achieve coplanarity within target specifications. By understanding the creep characteristics of the BGA package substrate and characterizing its particular warpage shape (e.g., concavely- or convexly-warped), a flattening apparatus embodiment was developed and adapted to apply an appropriate pushing force (e.g., a weight load) to thereby adjust the planarity of the BGA package in the presence of a heated environment. The combination of thermal creep and mechanical pushing can be achieved by placing the warped BGA package substrate into the flattening apparatus which include upper and lower plates sized and shaped to apply the appropriate pushing force in the heated environment while at the same time minimizing potential damage to the BGA package. We found our apparatus embodiments, as disclosed herein, to be surprisingly simple and cost-effective to implement for a broad variety of different types of warped BGA packages.

One embodiment of the disclosure is a flattening apparatus. FIGS. 1A-5B present various embodiments of the apparatus 100.

Figure 1A:
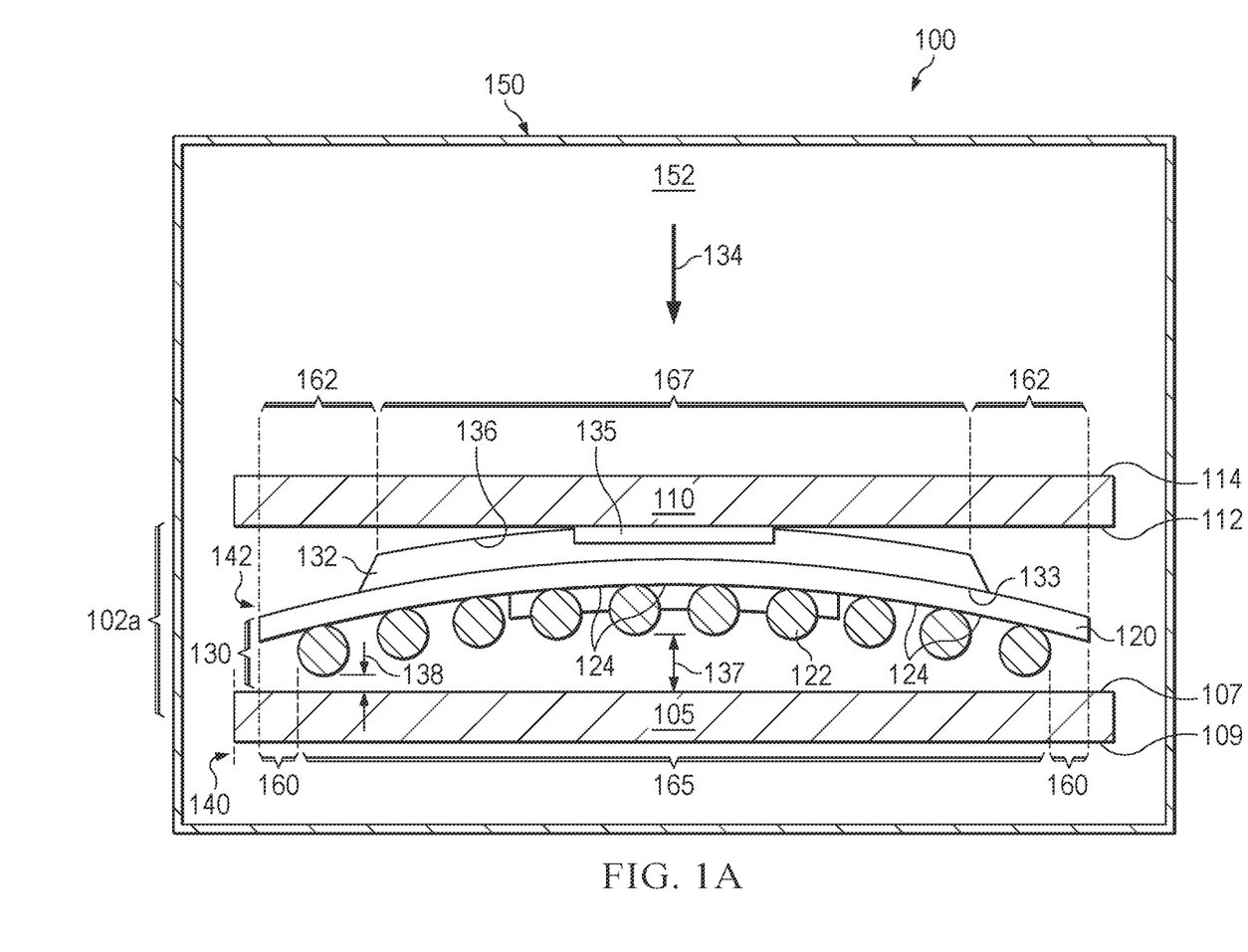
FIG. 1A presents a cross-sectional schematic view of an example embodiment of an apparatus of the disclosure while applying a pushing force to a convexly-warped BGA package.
Figure 1B:
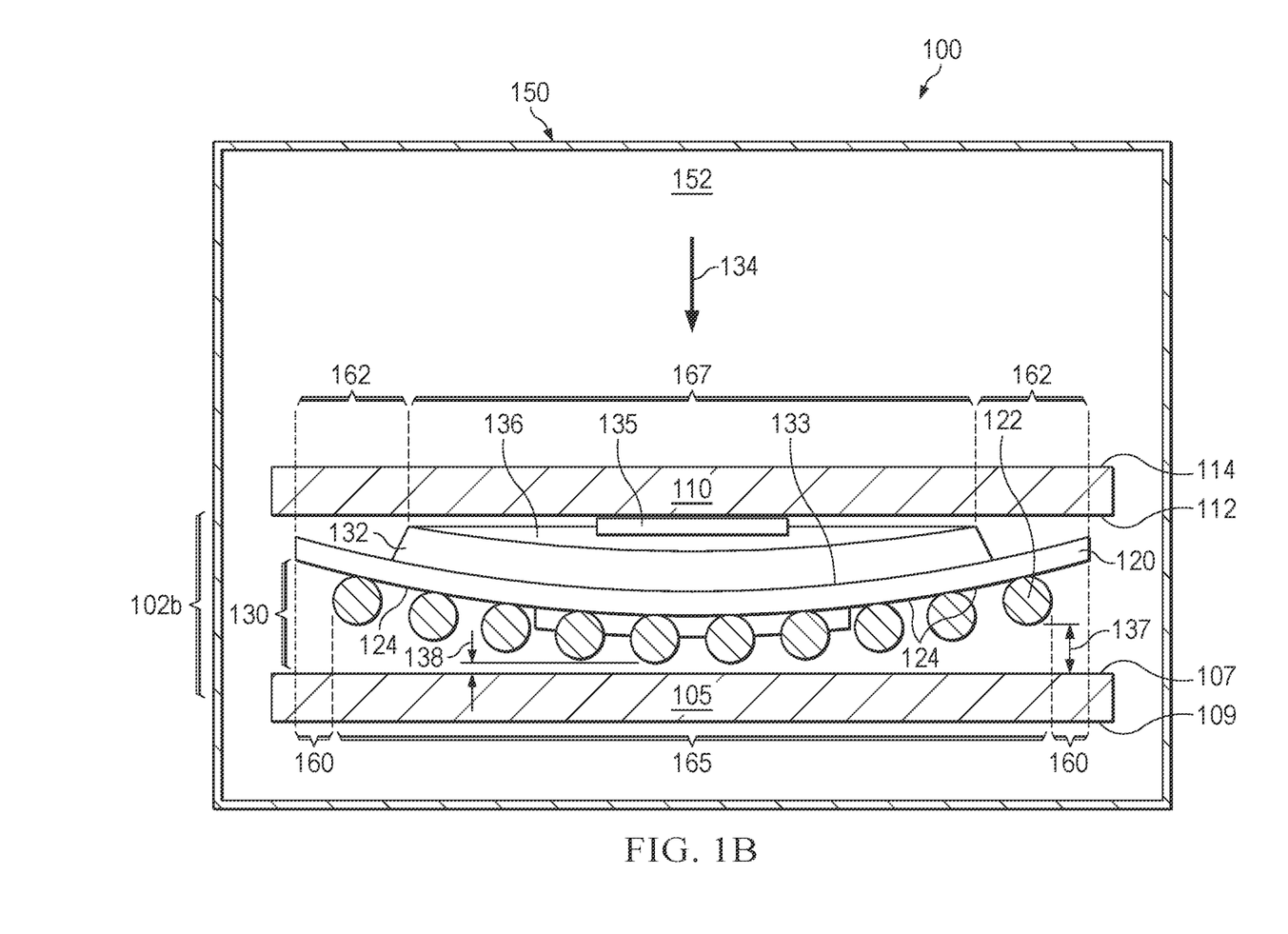
FIG. 1B presents a cross-sectional schematic view of an example embodiment of the apparatus of the disclosure while applying a pushing force to a concavely-warped BGA package.

FIGS. 1A and 1B present cross-sectional schematic views of an example embodiment of the apparatus 100 while applying a pushing force to convexly- and concavely-warped BGA packages 102, respectively.

The apparatus 100 includes a first plate 105 having a first surface 107 and opposite second surface 109 and a second plate 110 having a first surface 112 and opposite second surface 114. The first surface 107 of the first plate 105 and the first surface 112 of the second plate 110 oppose each other with a gap 115 there-between. The gap 115 houses, or is sized to house, the warped BGA package (e.g., BGA package 102a or 102b) there-in. The warped BGA package 102 includes a package substrate 120 with solder balls 122 attached to a device mounting surface 124 of the package substrate 120 to form a BGA 130 thereon. The gap 115 is adjustable by changing the position of the first plate 105 or of the second plate 110 such that a pushing force 134 is applicable to the warped BGA package 102.

As noted above, the warped BGA package can have a convexly-warped shape (e.g., package 102a, FIG. 1A) or a concavely-warped shape (e.g., 102b, FIG. 1B). Other embodiments of the warped BGA package can have more complex warpage shapes such as an M- or W-shaped warpages as familiar to those skilled in the art. As illustrated, embodiments of the warped BGA package 102 can further include a die substrate 132 connected to a die substrate mounting surface 133 of the package substrate 120 and a die 135 can be coupled to a die mounting surface 136 of the die substrate 132. Any embodiments of the warped BGA package 102 can further include packages with a stiffener made of a material that has a low coefficients of thermal expansion (e.g., less than 17 ppm/° C, or less than 12 ppm/° C in some embodiments), and/or with a lid heat spreader (e.g., copper lid heater spreader) coupled to the die 135 and die mounting surface 136, as familiar to those skilled in the pertinent art.

The term flattening, as used herein refers to returning or correcting (e.g., via embodiments of the apparatus and/or method disclosed herein) a mounting surface 124 and the die substrate mounting surface 133 of the warped BGA package 102 to a flat planar shape. That is, the warped BGA package is flatten to be within approved or target specifications for having coplanarity with a device surface (not shown) that the mounting surface 124 will be coupled to via the BGA 130.

The term coplanarity as used herein refers to the tips of the solder balls 122 of the BGA 130 (before reflow) on the mounting surface 124, all being in a common plane. Coplanarity can be characterized in terms of a difference in the distance of a solder ball of the BGA that is a maximum distance away from a flat surface (e.g., distance 137, surface 107, FIGS. 1A, 1B) and a different solder ball of the BGA that is minimum distance away from the flat surface (e.g., distance 138, surface 107).

For instance, as non-limiting examples, in various embodiments, the difference in distance (e.g., distance 137 minus distance 138) can be equal to or less than 50, 80, 100, 150, 200, 250, 300, 350, or 400 µm in order to meet a particular coplanarity specification. One of ordinary skill would appreciate that, while various package manufacturers may have different definitions and specifications of coplanarity, the embodiments of the apparatus and method disclosed herein can be readily adapted to facilitate flattening a BGA package to meet other coplanarity definitions and specifications.

In some embodiments of the apparatus 100, the first plate 105 can be a fixed bottom plate, the second plate 110 can be a moveable top plate and the second plate can have a mass that is sufficient to provide a pushing force to the warped BGA package which is equivalent to a pressure value on the BGA substrate area (e.g., the portion of the area of surface 124 occupied by the BGA 130) in a range from $2 \times 10^{-3}$ to $12 \times 10^{-3}$ MPa. In some such embodiments, the pressure value corresponding to the pushing force 134 can be attained by the plate 110 having a weight load in a range from, e.g., 300 to 700 g. For example, in various embodiments, the mass of the second plate 110 can be such that the weight load is in a range of 300 to 400, 350 to 450, 400 to 500, 450 to 550, 550 to 650, 600 to 700 g, or any combination thereof.

Providing plates of a particular mass are a convenient and readily adaptable way to provide different weight loads correspond to different pushing forces as needed for various types of different BGA packages as needed. However, in other embodiments, the pushing force can be applied by different mechanisms. For example, in some embodiments, the second plate 110 (e.g., top plate) can fixed and the first plate 105 (e.g., bottom plate) can be moveable upwards e.g., by a motorized or manual mechanical lift coupled to the first plate (e.g., coupled to the second surface 109), to thereby apply the pushing force. For example, in some embodiments both first and second plates 105, 110 (e.g., bottom and top plates, respectively) can be moveable towards each other so as to apply the pushing force.

Figure 2:
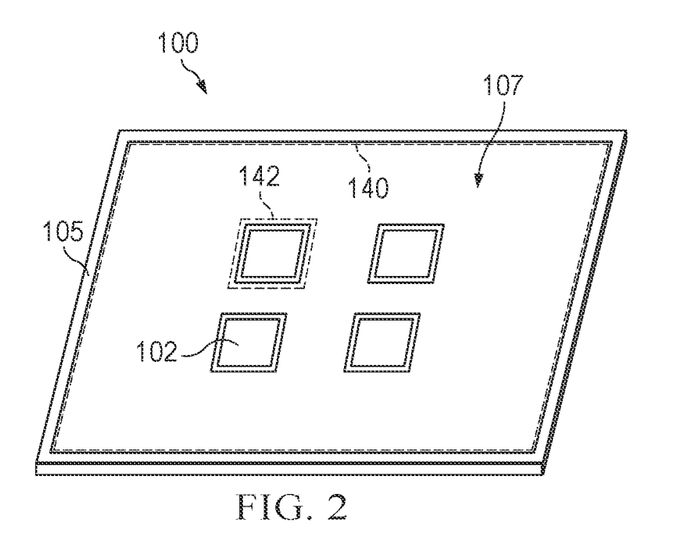
FIG. 2 presents a schematic plan view of an embodiment of a first plate (e.g., bottom plate) of the apparatus of the disclosure.

FIG. 2 presents a schematic plan view of an embodiment of a first plate 105 (e.g., bottom plate) of the apparatus 100 of the disclosure. As illustrated, the first surface 107 of the first plate 105 can have a perimeter 140 that is greater than a perimeter 142 of the warped BGA package 102 such that when the warped BGA package 102 is located on the first plate 105, the perimeter 142 of the warped BGA package 102 is within the perimeter 140 the first surface 107 of the first plate 105. In some such embodiments, to facilitate batch flattening, of the perimeter 140 of the first surface 107 of the first plate 105 can greater than the perimeters 142 of a plurality of the warped BGA packages 102 such that, when the plurality of warped BGA packages 102 are adjacently located on the first plate 105, the perimeters 142 of the warped BGA packages 102 are all within the perimeter 140 the first surface 107 of the first plate 105.

Figure 3:
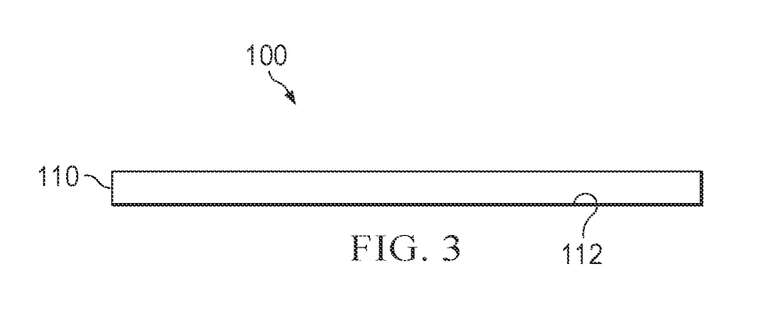
FIG. 3 presents a schematic side view of an embodiment of a second plate (e.g., top plate) of the apparatus of the disclosure.

FIG. 3 presents a schematic side view of an embodiment of a second plate 110 (e.g., top plate) of the apparatus 100 of the disclosure. To help insure that additional or different warpage is not introduced by the pushing force 134, the first surface 112 of the second plate 110 can be a flat and smooth surface. For similar reasons, in some embodiments, the first plate 105 surface 107 can alternatively of additionally be a similarly flat and smooth surface.

For instance, consider a package specification where the warped BGA package after flattening is to have a target coplanarity of 200 μm. Embodiments of the first surface 112 of the second plate 110 (and/or the first surface 107 of the first plate 105) can advantageously be provided to have a coplanarity no higher than 20 μm, and a surface roughness corresponding to a roughness average (Ra) of no higher than 32 micro-inches (μ-in). Or, consider a package specification where the flatten BGA package is to have a target coplanarity of 100 μm. Embodiments of the first surface 112 of the second plate 110 (and/or the first surface 107 of the first plate 105) can have a coplanarity no higher than 10 μm, and roughness average no higher than 16μ-in.

As also illustrated in FIGS. 1A and 1B, to facilitate inducing thermal creep, embodiments of the apparatus 100 can further include a heater 150. Embodiments of the heater 150 can have a chamber 152 sized to hold the first and second plates and the warped BGA package therein. As a non-limiting example, the heater can be designed to heat the chamber to a substantially constant (e.g., ±1° C., ±2° C., ±5° C.) temperature value that is in a range from 85 to 150° C. during the application of the pushing force 134 to the warped BGA package 102. The constant temperature value selected will depend on the different types and sizes of BGA as well as the solder ball alloy composition. As non-limiting examples, for a flip chip BGA with SAC solder balls, a constant temperature value in a range from 125 to 150° C. can be selected. For volume production, in which less load or pressure and shorter times are desirable, a constant temperature value in a range from 140 to 150° C. (e.g., 140 to 150, 140 to 142, 142 to 144, 144 to 146, 148 to 150° C. or any combination thereof) can be selected.

Figure 4A:
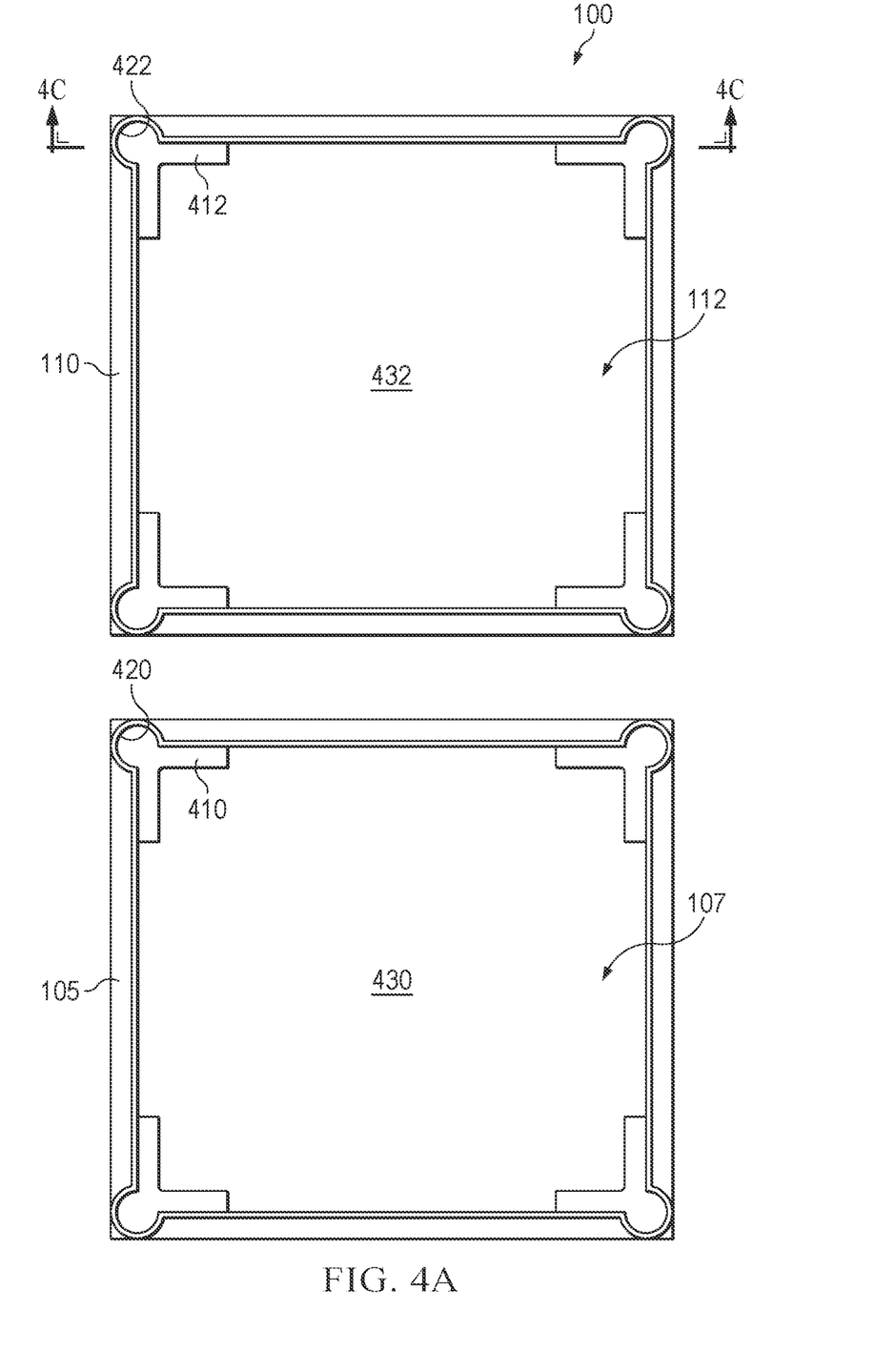
FIG. 4A presents a schematic plan view of an embodiment of the first and second plates of the apparatus of the disclosure.
Figure 4B:
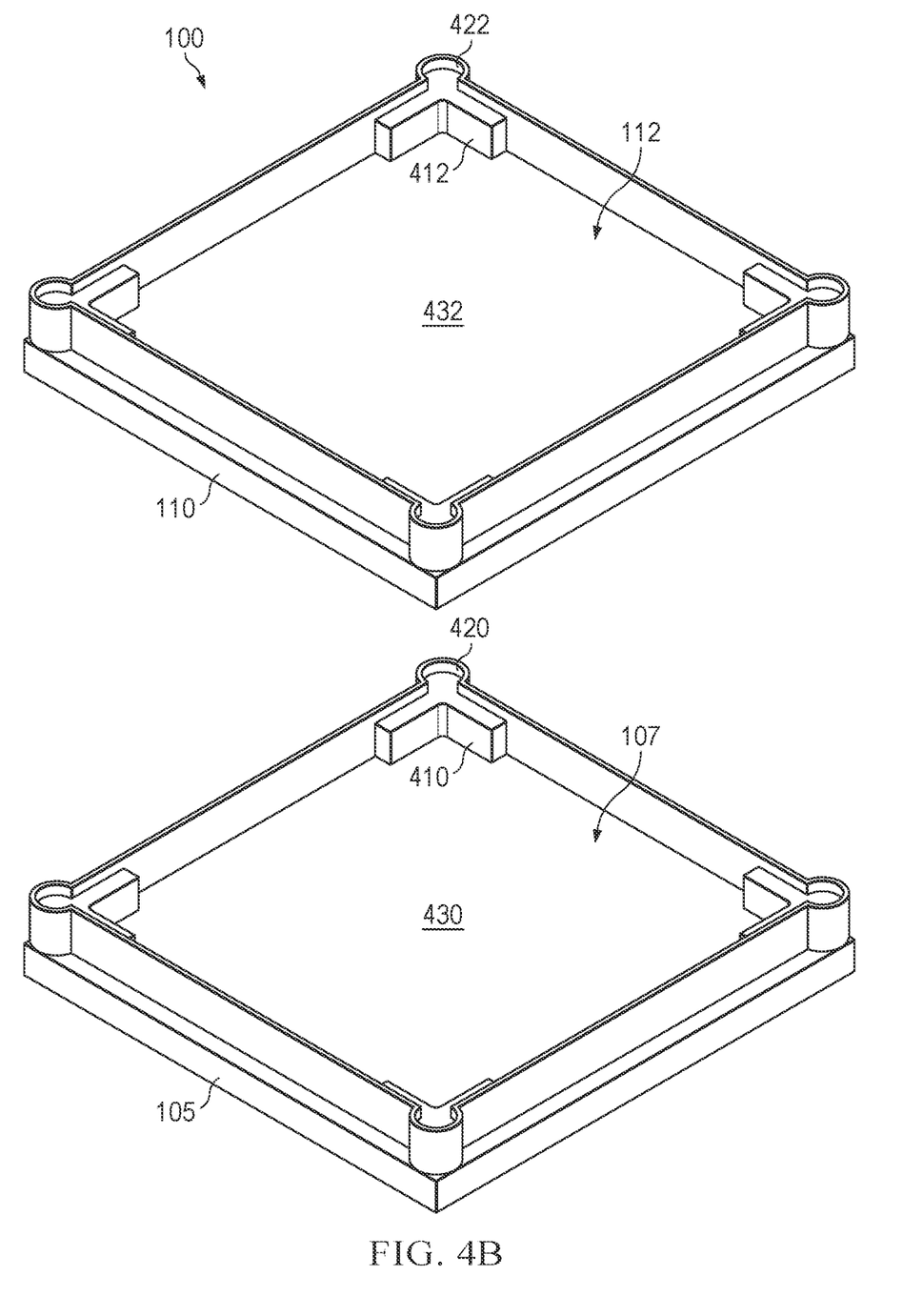
FIG. 4B presents another schematic perspective view of another embodiment of the first and second plates of the apparatus of the disclosure.
Figure 4C:
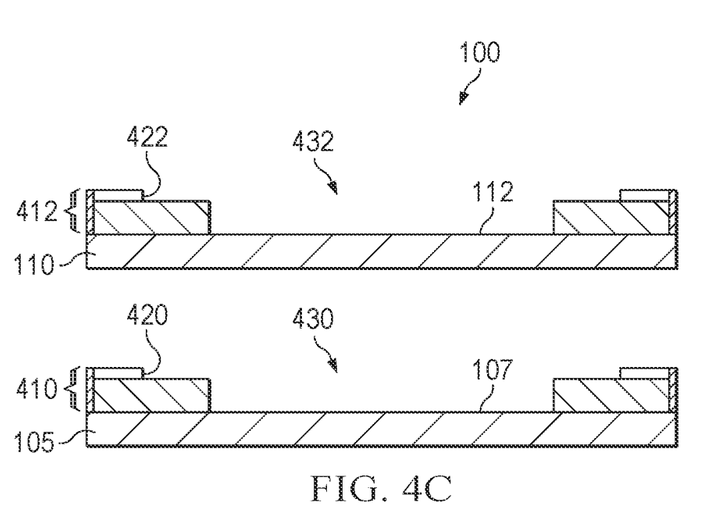
FIG. 4C presents another schematic cross-sectional view of another embodiment of the first and second plates of the apparatus of the disclosure.
Figure 5A:
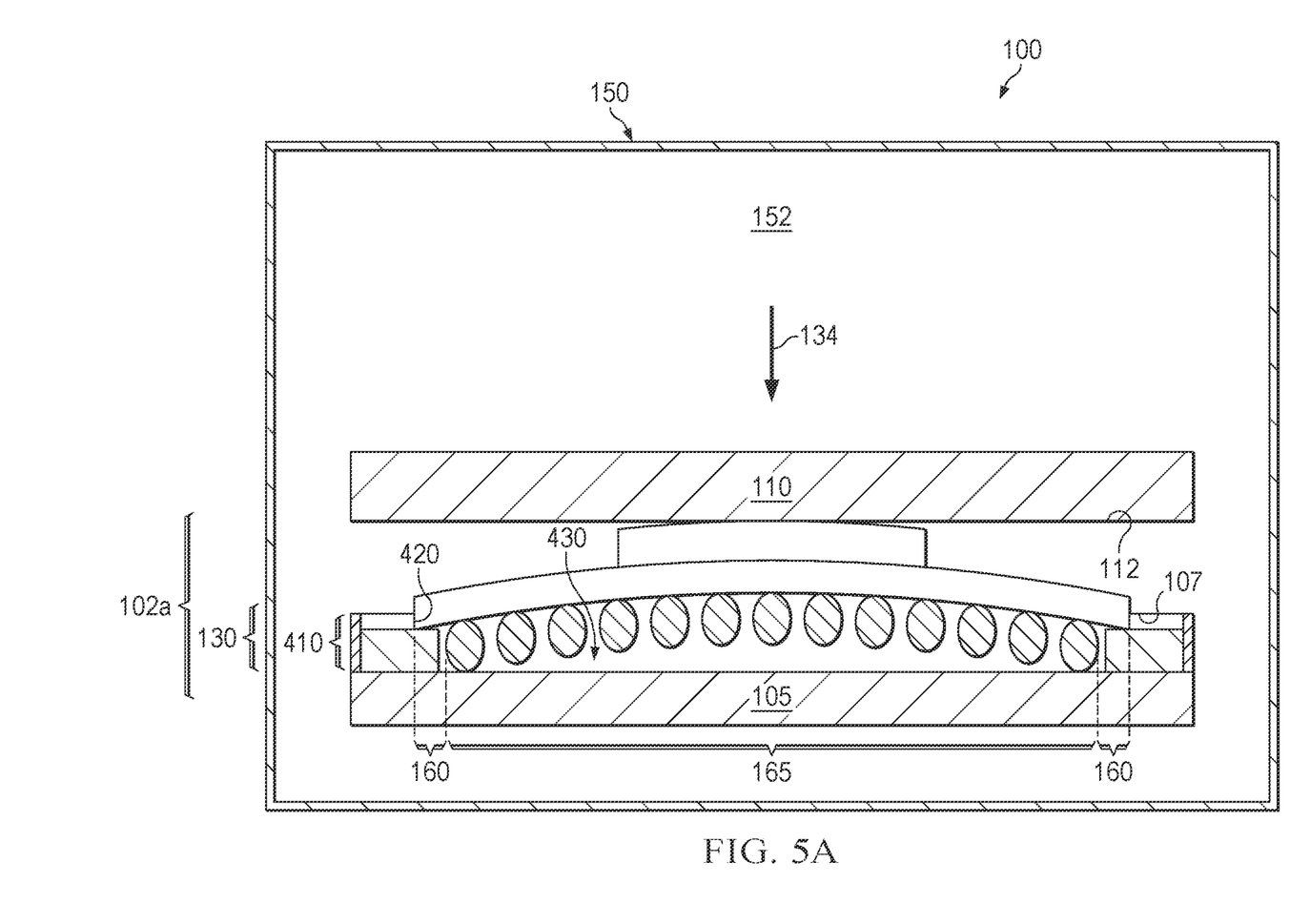
FIG. 5A presents a schematic cross-sectional view of an example embodiment of the apparatus of the disclosure while applying a pushing force to a convexly-warped BGA package in a heated environment.
Figure 5B:
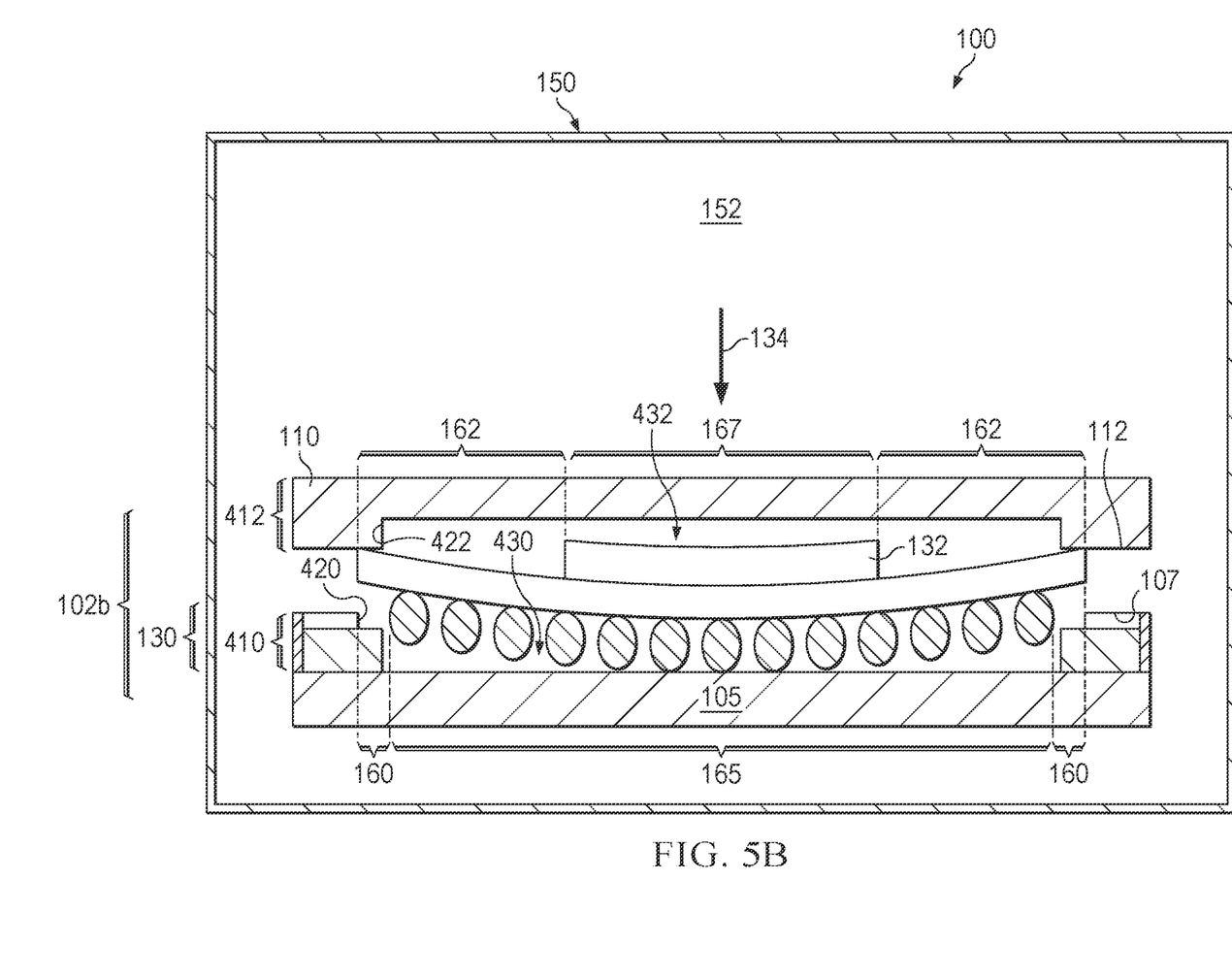
FIG. 5B presents a schematic cross-sectional view of an example embodiment of the apparatus of the disclosure while applying a pushing force to a concavely-warped BGA package in a heated environment.

FIGS. 4A to 4C present schematic plan, perspective and cross-sectional views of various embodiments of the first plate 105 and the second plate 110 of the apparatus 100 including corner steps 410, 412 and ledge surfaces 420, 422. FIGS. 5A and 5B present schematic cross-sectional views of example embodiments of the apparatus having such corner steps and ledge surfaces, while applying a pushing force to a convexly-warped BGA package or concavely-warped BGA package, respectively, in a heated environment.

As illustrated, to facilitate avoiding damaging components of the BGA package, one or both of the first and second plates 105, 110 can include corner steps 410, 412 having a ledge surface 420, 422, respectively. The corner steps 410, 412 can define one or more cavities 430, 432 such that one or both of edge portions (e.g., portions 160, 162 of the device mounting surface 124 and the die substrate mounting surface 133 of the warped BGA package 102, FIGS. 1A, 1B, 5A and 5B) can contact the ledge surface 420, 422, respectively. Interior portions 165, 167 of the device mounting surface 124 and the die substrate mounting surface 133 can lay within the one or more cavities 430, 432, respectively, without contacting the first and the second plates 105, 110.

As illustrated in FIG. 5A, when the warped BGA package 102a is a convexly-warped BGA package, the first plate 105 can include the corner steps 410 having a ledge surface 420, the corner steps 410 defining the cavity 430 such that the edge portion 160 of the device mounting surface 124 contacts the ledge surface 420 and an interior portion 165 of the device mounting surface 124 including the BGA 130 is located in the cavity 430 without contacting the first plate 105.

As illustrated in FIG. 5B, when the warped BGA package 102a is a concavely-warped BGA package, the first plate 105 can include corner steps 410 having a ledge surface 422. The corner steps 410 define a cavity 430 such that an edge portion 162 of the device mounting surface 124 contacts the ledge surface 422 and an interior portion 165 of the device mounting surface 124 including the BGA 130 is located in the cavity 430 without contacting the first plate 105. The second plate 110 can include corner steps 412 having a ledge surface 422, the corner steps 412 defining a cavity 432 such that an edge portion 162 of the die substrate mounting surface 133 contacts the ledge surface 422 and an interior portion 167 of the die substrate mounting surface 133, including a die substrate 132, is located in the cavity 432 without contacting the second plate 110.

The plates can be composed of any material that is resistant to thermal warpage. As non-limiting examples, for some embodiments of the apparatus, the first plate 105 can be made of a rigid and dense material such as stainless steel. In some embodiments, the second plate 110 can be made of lower manufacturing cost materials such as aluminum. In other embodiments, either or both plates 105, 110 can be made of stainless steel, aluminum, copper or similar materials.

Figure 6A:
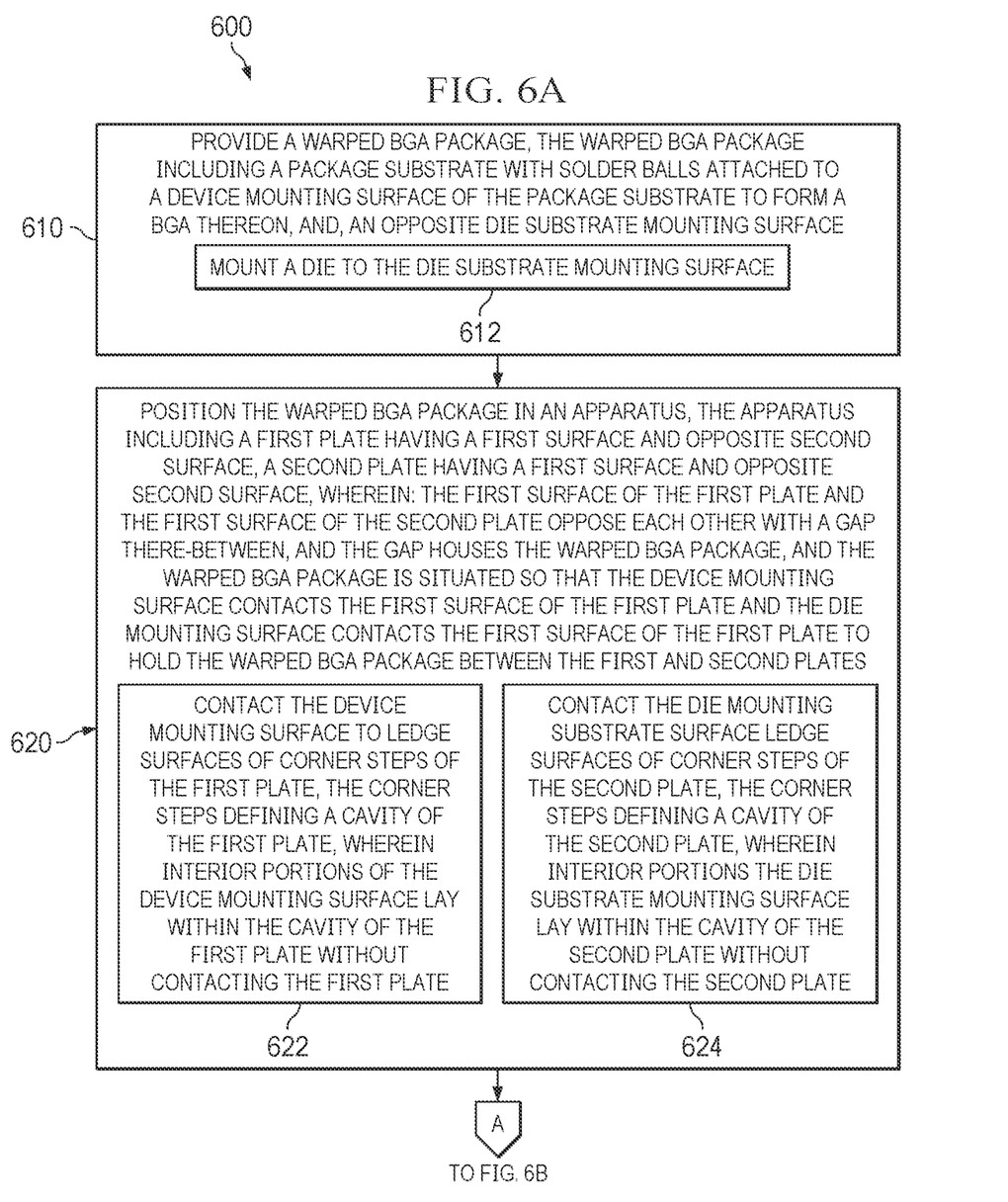
FIGS. 6A and 6B present a flow diagram of example embodiments of a method of manufacturing a flattened BGA package including flattening a warped BGA package using any embodiments of the apparatus disclosed in the context of FIGS. 1A-5B.
Figure 6B:
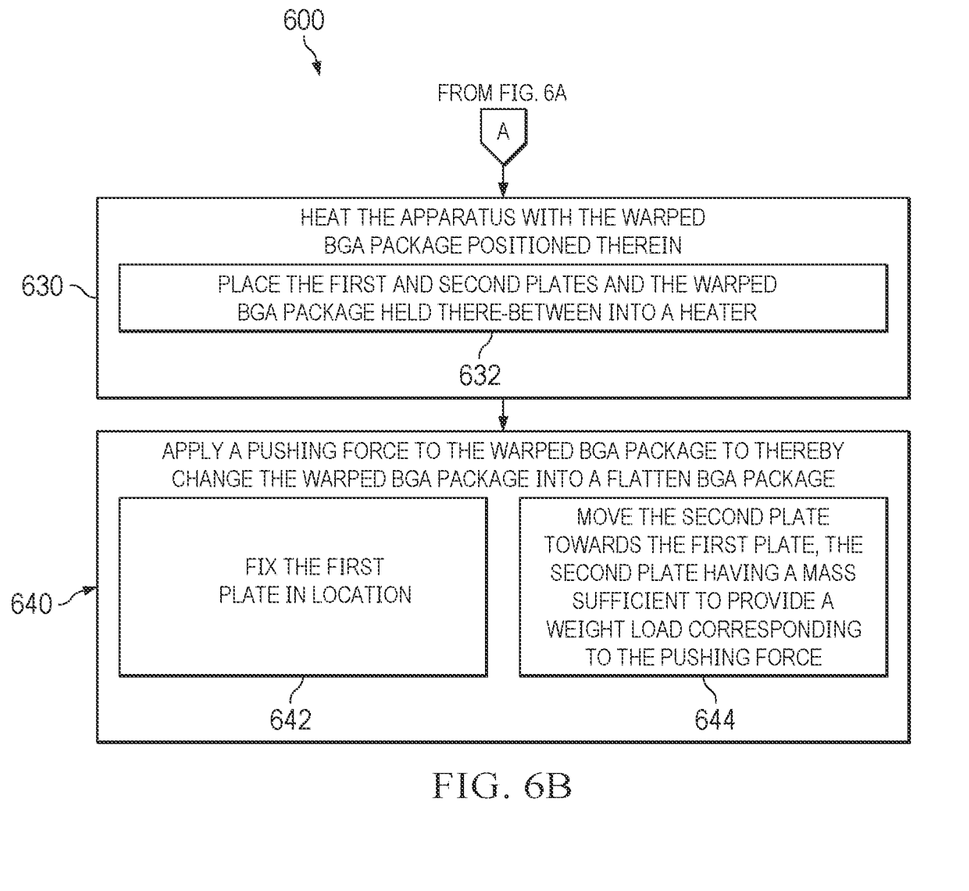

Another embodiment of the disclosure is a method manufacturing a flattened BGA package. With continuing reference to FIGS. 1A-5B throughout, FIGS. 6A and 6B presents a flow diagram of example embodiments of a method 600 of manufacturing a flattened BGA package to flatten a warped BGA package, including flattening using any embodiments of the apparatus 100 as disclosed in the context of FIGS. 1A-5B.

The method includes providing (step 610) a warped BGA package 102. The warped BGA package includes a package substrate 120 with solder balls 122 attached to a device mounting surface 124 of the package substrate 120 to form a BGA 130 thereon and, an opposite die substrate mounting surface 136. The method also includes positioning (step 620) the warped BGA package in an apparatus 100, the apparatus including a first plate 105 having a first surface 107 and opposite second surface 109, a second plate 110 having a first surface 112 and opposite second surface 114. The first surface 107 of the first plate 105 and the first surface 112 of the second plate 110 oppose each other with a gap 115 there-between, and the gap 115 houses the warped BGA package 102. The warped BGA package is situated so that the device mounting surface 124 contacts the first surface 107 of the first plate 105 and the die mounting surface 136 contacts the first surface 112 of the first plate 110 to hold the warped BGA package between the first and second plates 105, 110. The method further includes heating (step 630) the apparatus 100 with the warped BGA package positioned therein. The method also includes applying (step 640) a pushing force (134) to the warped BGA package to thereby change the warped BGA package 102 into a flatten BGA package.

In some embodiments of the method, applying the pushing force (step 640) includes fixing (step 642) the first plate in location and moving the second plate (step 644) towards the first plate, the second plate having a mass sufficient to provide a weight load corresponding to the pushing force applied to the warped BGA package 102 as part of step 640.

It is important that the mass of the second plate 110 be carefully selected to provide a sufficient pushing force 134 (step 640) but not too great a pushing force as to damage components of the BGA package. For instance, an insufficient mass can result in an insufficient pushing force 134 which in turn results in insufficient flattening. For instance, an excessive mass can result in an excessive pushing force such that the one or more of the solder balls are pushed into the first plate 105 such and thereby damaging the solder balls.

In some embodiments as part of applying the pushing force (step 640), the weight load of the second plate applies a pressure to the BGA package that is a value in a range from $2\times10^{-3}$ to $12\times10^{-3}$ MPa (e.g., $2\times10^{-3}$ to $4\times10^{-3}$ MPa, $4\times10^{-3}$ to $6\times10^{-3}$ MPa, $6\times10^{-3}$ to $8\times10^{-3}$ MPa, $8\times10^{-3}$ to $10\times10^{-3}$ MPa, $10\times10^{-3}$ to $12\times10^{-3}$ MPa, or any combination thereof).

In some embodiments of the method, applying heat (step 630) includes placing (step 632) the first and second plates and the warped BGA package held there-between into a heater 150.

Some embodiments of the heating (step 630) include setting a temperature of an environment surrounding the warped BGA package (e.g., the chamber 152 inside the heater 150) to a constant value in a range from 120 to 130° C. (e.g., 120 to 122, 122 to 124, 124 to 126, 128 to 130° C. or combinations thereof) for a period of time in a range from 60 to 360 minutes (e.g., to 150, 90 to 180, 120 to 210, 150 to 240, 180 to 270, 210 to 300, 240 to 360 minutes or any combinations thereof). In view of the present disclosure, one skilled in the pertinent art would understand how these temperatures and time could be adjusted in order to achieve the desire amount of flattening.

In some embodiments of the method, the positioning of the warped BGA package (step 620) can include contacting (step 622) the device mounting surface 124 to ledge surfaces 420 of corner steps 410 of the first plate 105, the corner steps 410 defining a cavity 430 of the first plate 105. Additionally or alternatively, the positioning (step 620) can include contacting (step 624) the die mounting substrate surface 133 to ledge surfaces 422 of corner steps 412 of the second plate 110, the corner steps defining a cavity 432 of the second plate 110. As part of such contacting (steps 622 and/or 624) interior portions 165, 167 of the device mounting surface 124 and the die mounting substrate surface 133 lay within the cavity 430 of the first plate 105 or the cavity 432 of the second plate 110, respectively, without contacting the first and the second plates 105, 110. In some such embodiments, before the positioning (step 620), the providing of the warped BGA package step 610) can include mounting a die 135 to the die substrate mounting surface 133 (step 612), and therefore, part of contacting (step 655) to the die mounting substrate surface includes the die 135 laying within the cavity 432 without contacting the second plate 110.

For example, in some embodiments, when the warped BGA package is a convexly-warped BGA package (e.g., FIG. 1A, package 102a), the positioning (step 620) can include contacting (step 622) the device mounting surface 124 to a ledge surface 420 of corner steps 410 of the first plate 105, the corner steps 410 defining a cavity 430 of the first plate 105, and, an interior portion 165 of the device mounting surface 124 lays within the cavity 430 without contacting the first plate 105. For example, in some embodiments when the warped BGA package is a concavely-warped BGA package (e.g., FIG. 1B, package 102b), the positioning (step 620) can include contacting (step 624) the die mounting substrate surface 133 to a ledge surface 422 of corner steps 412 of the second plate 110, the corner steps defining a cavity 432 of the second plate 110, and, interior portions 167 of the die substrate mounting surface 133 lays within the cavity 432 without contacting the second plate 110.

Figure 7:
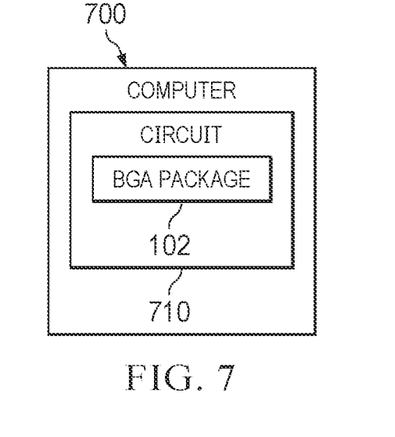
FIG. 7 presents a block diagram of a computer including one or more embodiments of the BGA package flatten by method of the disclosure including any of the embodiments of the method disclosed in the context of FIGS. 6A and 6B.

Another embodiment of the disclosure is computer having one or more circuits that include any embodiments of the flattened BGA package as disclosed herein. FIG. 7 presents a block diagram of a computer 700 having one or more circuits 710 that include any embodiments of the flatted BGA package 102 using any embodiments of the flattening apparatus 100 and method 600 of manufactured as disclosed herein.

Those skilled in the art to which this application relates will appreciate that other and further additions, deletions, substitutions and modifications may be made to the described embodiments.

What is claimed is:

1. An apparatus for flattening a warped ball grid array (BGA) package, comprising:
   a first plate having a first surface and opposite second surface;
   a second plate having a first surface and opposite second surface, wherein:
      the first surface of the first plate and the first surface of the second plate oppose each other with a gap there-between,
      the gap houses the warped BGA package there-in,
      the warped BGA package includes a package substrate with solder balls attached to a device mounting surface of the package substrate to form a BGA thereon, and
      the gap is adjustable by changing the position of the first plate or of the second plate such that a pushing force is applicable to the warped BGA package; and wherein
   one or both of the first and second plates include corner steps having a ledge surface the corner steps defining one or more cavities such that one or both of edge portions of the device mounting surface and the die substrate mounting surface of the warped BGA package contact the ledge surface, respectively, and interior portions of the device mounting surface and the die substrate mounting surface lay within the one or more cavities, respectively, without contacting the first and the second plates.

2. The apparatus of claim 1, wherein the first plate is a fixed bottom plate, the second plate is a moveable top plate and the second plate has a mass sufficient to provide a pushing force to the warped BGA package which is equivalent to a pressure value on the BGA substrate area in a range from $2\times10^{-3}$ to $12\times10^{-3}$ MPa.

3. The apparatus of claim 1, wherein the first surface of the first plate has a perimeter that is greater than a perimeter of the warped BGA package such that when the warped BGA package is located on the first plate, the perimeter of the warped BGA package is within the perimeter the first surface of the first plate.

4. The apparatus of claim 3, wherein the perimeter of the first surface of the first plate is greater than the perimeters of a plurality of the warped BGA packages such that, when the plurality of warped BGA packages are adjacently located on the first plate, the perimeters of the warped BGA packages are all within the perimeter the first surface of the first plate.

5. The apparatus of claim 1, wherein the first surface of the second plate is flat and smooth.

6. The apparatus of claim 1, further including a heater having a chamber sized to hold the first and second plates and the warped BGA package therein and to heat the chamber to a constant temperature value in a range from 85 to 150° C. during the application of the pushing force to the warped BGA package.

7. An apparatus for flattening a warped ball grid array (BGA) package, comprising:

a first plate having a first surface and opposite second surface;

a second plate having a first surface and opposite second surface, wherein:

the first surface of the first plate and the first surface of the second plate oppose each other with a gap there-between, the gap houses the warped BGA package there-in, the warped BGA package includes a package substrate with solder balls attached to a device mounting surface of the package substrate to form a BGA thereon, and the gap is adjustable by changing the position of the first plate or of the second plate such that a pushing force is applicable to the warped BGA package; and wherein, when the warped BGA package is a convexly-warped BGA package, the first plate includes corner steps having a ledge surface, the corner steps defining a cavity such that an edge portion of the device mounting surface contacts the ledge surface and an interior portion of the device mounting surface including the BGA is located in the cavity without contacting the first plate.

8. An apparatus for flattening a warped ball grid array (BGA) package, comprising:

a first plate having a first surface and opposite second surface;

a second plate having a first surface and opposite second surface, wherein:

the first surface of the first plate and the first surface of the second plate oppose each other with a gap there-between, the gap houses the warped BGA package there-in, the warped BGA package includes a package substrate with solder balls attached to a device mounting surface of the package substrate to form a BGA thereon, and the gap is adjustable by changing the position of the first plate or of the second plate such that a pushing force is applicable to the warped BGA package; and wherein, when the warped BGA package is a concavely-warped BGA package:

the first plate includes corner steps having a ledge surface, the corner steps defining a cavity such that an edge portion of the device mounting surface contacts the ledge surface and an interior portion of the device mounting surface including the BGA is located in the cavity without contacting the first plate, and the second plate includes corner steps having a ledge surface, the corner steps defining a cavity such that an edge portion of the die substrate mounting surface contacts the ledge surface and an interior portion of the die substrate mounting surface, including a die substrate, is located in the cavity without contacting the second plate.

9. The apparatus of claim 1, wherein the first and second plates are metal plates.

10. A method of manufacturing a flattened BGA package, comprising:

providing a warped BGA package, the warped BGA package including:

a package substrate with solder balls attached to a device mounting surface of the package substrate to form a BGA thereon and, an opposite die substrate mounting surface;

positioning the warped BGA package in an apparatus, the apparatus including a first plate having a first surface and opposite second surface, a second plate having a first surface and opposite second surface, wherein:

the first surface of the first plate and the first surface of the second plate oppose each other with a gap there-between, and the gap houses the warped BGA package, and the warped BGA package is situated so that the device mounting surface contacts the first surface of the first plate and the die mounting surface contacts the first surface of the first plate to hold the warped BGA package between the first and second plates;

heating the apparatus with the warped BGA package positioned therein; and applying a pushing force to the warped BGA package to thereby change the warped BGA package into a flattened BGA package, wherein the positioning of the warped BGA package includes one or both of:

contacting the device mounting surface to ledge surfaces of corner steps of the first plate, the corner steps defining a cavity of the first plate, or contacting the die mounting substrate surface to ledge surfaces of corner steps of the second plate, the corner steps defining a cavity of the second plate, wherein interior portions of the device mounting surface and the die substrate mounting surface lay within the cavity of the first plate or the cavity of the second plate, respectively, without contacting the first and the second plates.

11. The method of claim 10, wherein the applying of the pushing force includes fixing the first plate in location and moving the second plate towards the first plate, the second plate having a mass sufficient to provide a weight load corresponding to the pushing force.

12. The method of claim 11, wherein the weight load of the second plate applies a pressure to the BGA package that is a value in a range from $4\times10^{-3}$ to $8\times10^{-3}$ MPa.

13. The method of claim 10, wherein the heating further includes placing the first and second plates and the warped BGA package held there-between into a heater.

14. The method of claim 10, wherein the heating includes setting a temperature of an environment surrounding the warped BGA package to a constant value (e.g. ±1° C.) in a range from 85 to 150° C. for a period of time in a range from 60 to 360 minutes.

15. A method of manufacturing a flattened BGA package, comprising:

providing a warped BGA package, the warped BGA package including:

a package substrate with solder balls attached to a device mounting surface of the package substrate to form a BGA thereon and, an opposite die substrate mounting surface;

positioning the warped BGA package in an apparatus, the apparatus including a first plate having a first surface and opposite second surface, a second plate having a first surface and opposite second surface, wherein:

the first surface of the first plate and the first surface of the second plate oppose each other with a gap there-between, and the gap houses the warped BGA package, and the warped BGA package is situated so that the device mounting surface contacts the first surface of the first plate and the die mounting surface contacts the first surface of the first plate to hold the warped BGA package between the first and second plates;

heating the apparatus with the warped BGA package positioned therein; and applying a pushing force to the warped BGA package to thereby change the warped BGA package into a flattened BGA package, wherein before the positioning, the providing of the warped BGA package includes mounting a die to the die substrate mounting surface and to the die mounting substrate surface includes the die laying within the cavity without contacting the second plate.

16. A method of manufacturing a flattened BGA package, comprising:

providing a warped BGA package, the warped BGA package including:
- a package substrate with solder balls attached to a device mounting surface of the package substrate to form a BGA thereon and,
- an opposite die substrate mounting surface;

positioning the warped BGA package in an apparatus, the apparatus including a first plate having a first surface and opposite second surface, a second plate having a first surface and opposite second surface, wherein:
- the first surface of the first plate and the first surface of the second plate oppose each other with a gap there-between, and the gap houses the warped BGA package, and
- the warped BGA package is situated so that the device mounting surface contacts the first surface of the first plate and the die mounting surface contacts the first surface of the first plate to hold the warped BGA package between the first and second plates;

heating the apparatus with the warped BGA package positioned therein; and applying a pushing force to the warped BGA package to thereby change the warped BGA package into a flattened BGA package, wherein when the warped BGA package is a convexly-warped BGA package, the positioning includes contacting the device mounting surface to a ledge surface of corner steps of the first plate, the corner steps defining a cavity of the first plate, and, an interior portion of the device mounting surface lays within the cavity without contacting the first plate.

17. The method of claim 10, wherein, when the warped BGA package is a concavely-warped BGA package, the positioning includes contacting the die substrate surface to a ledge surface of corner steps of the second plate, the corner steps defining a cavity of the second plate, and, interior portions of the die substrate mounting surface lays within the cavity without contacting the second plate.

18. A computer having one or more circuits that include the flattened BGA package of claim 10.

19. The apparatus of claim 7, wherein the first plate is a fixed bottom plate, the second plate is a moveable top plate and the second plate has a mass sufficient to provide a pushing force to the warped BGA package which is equivalent to a pressure value on the BGA substrate area in a range from $2 \times 10^{-3}$ to $12 \times 10^{-3}$ MPa.

20. The apparatus of claim 7, wherein the first surface of the first plate has a perimeter that is greater than a perimeter of the warped BGA package such that when the warped BGA package is located on the first plate, the perimeter of the warped BGA package is within the perimeter the first surface of the first plate.

21. The apparatus of claim 20, wherein the perimeter of the first surface of the first plate is greater than the perimeters of a plurality of the warped BGA packages such that, when the plurality of warped BGA packages are adjacently located on the first plate, the perimeters of the warped BGA packages are all within the perimeter the first surface of the first plate.

22. The apparatus of claim 7, wherein the first surface of the second plate is flat and smooth.

23. The apparatus of claim 7, further including a heater having a chamber sized to hold the first and second plates and the warped BGA package therein and to heat the chamber to a constant temperature value in a range from 85 to 150° C. during the application of the pushing force to the warped BGA package.

24. The apparatus of claim 8, wherein the first plate is a fixed bottom plate, the second plate is a moveable top plate and the second plate has a mass sufficient to provide a pushing force to the warped BGA package which is equivalent to a pressure value on the BGA substrate area in a range from $2 \times 10^{-3}$ to $12 \times 10^{-3}$ MPa.

25. The apparatus of claim 8, wherein the first surface of the first plate has a perimeter that is greater than a perimeter of the warped BGA package such that when the warped BGA package is located on the first plate, the perimeter of the warped BGA package is within the perimeter the first surface of the first plate.

26. The apparatus of claim 25, wherein the perimeter of the first surface of the first plate is greater than the perimeters of a plurality of the warped BGA packages such that, when the plurality of warped BGA packages are adjacently located on the first plate, the perimeters of the warped BGA packages are all within the perimeter the first surface of the first plate.

27. The apparatus of claim 8, wherein the first surface of the second plate is flat and smooth.

28. The apparatus of claim 8, further including a heater having a chamber sized to hold the first and second plates and the warped BGA package therein and to heat the chamber to a constant temperature value in a range from 85 to 150° C. during the application of the pushing force to the warped BGA package.

29. The method of claim 15, wherein, when the warped BGA package is a concavely-warped BGA package, the positioning includes contacting the die substrate surface to a ledge surface of corner steps of the second plate, the corner steps defining a cavity of the second plate, and, interior portions of the die substrate mounting surface lays within the cavity without contacting the second plate.

30. A computer having one or more circuits that include the flattened BGA package of claim 15.

31. A computer having one or more circuits that include the flattened BGA package of claim 16.

32. A computer having one or more circuits that include the flattened BGA package of claim 17.

* * * * *